US012738911B2

(12) United States Patent
Nguyen et al.

(10) Patent No.: US 12,738,911 B2
(45) Date of Patent: Sep. 15, 2026

(54) OPEN-COLLECTOR VARIABLE GAIN AMPLIFIER AND METHOD THEREFOR

(71) Applicant: MACOM Technology Solutions Holdings, Inc., Lowell, MA (US)

(72) Inventors: Nguyen Nguyen, San Jose, CA (US); Trong Phan, Garden Grove, CA (US); William Allen, Gansevoort, NY (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 831 days.

(21) Appl. No.: 18/055,647

(22) Filed: Nov. 15, 2022

(65) Prior Publication Data

US 2024/0162873 A1 May 16, 2024

(51) Int. Cl.

*H03F 3/45* (2006.01)
*H03F 3/60* (2006.01)
*H03G 3/30* (2006.01)
*H10P 54/00* (2026.01)
*H10W 72/90* (2026.01)

(52) U.S. Cl.

CPC ............. *H03G 3/30* (2013.01); *H03F 3/4508* (2013.01); *H03F 3/605* (2013.01); *H03F 2203/45022* (2013.01); *H03G 2201/103* (2013.01); *H10P 54/00* (2026.01); *H10W 72/952* (2026.01)

(58) Field of Classification Search

CPC .. H03G 3/30; H03G 2201/103; H03G 1/0088; H03F 3/4508; H03F 2203/45022; H03F 1/56; H03F 3/245; H03F 3/45103; H03F 2200/294; H03F 3/195; H03F 2200/451; H01L 21/78; H01L 24/05; H01L 2224/05611; H01L 2224/05624; H01L 2224/05639; H01L 2224/05644; H01L 2224/05647; H01L 2224/05655; H01L 2224/05666; H01L 2224/05669; H01L 24/13

USPC .......................................................... 330/254

See application file for complete search history.

(56) References Cited

U.S. PATENT DOCUMENTS 5,550,513 A * 8/1996 Wong ..................... H03G 7/001 330/54

8,154,343 B2 * 4/2012 Moonen ................ H03F 1/3211 330/252

(Continued)

*Primary Examiner* — Jessica Han
*Assistant Examiner* — Khiem D Nguyen
(74) *Attorney, Agent, or Firm* — Robert D. Atkins; PATENT LAW GROUP

(57) ABSTRACT

An amplifier circuit has a variable gain amplifier including an input receiving an input signal and an open-conduction output, and an output stage including an input coupled to the open-conduction output of the variable gain amplifier and an output providing an output signal of the amplifier circuit. The variable gain amplifier has a first transistor and second transistor each having a control input receiving the input signal. A third transistor has a control terminal receiving a control signal and a first conduction terminal coupled to a first conduction terminal of the first transistor and a second conduction terminal being a first terminal of the open-conduction output. A fourth transistor has a control terminal receiving the control signal and a first conduction terminal coupled to a first conduction terminal of the second transistor and a second conduction terminal being a second terminal of the open-conduction output.

17 Claims, 8 Drawing Sheets

(56) References Cited

U.S. PATENT DOCUMENTS

| | | | | |
|---|---|---|---|---|
| 8,742,846 | B1 * | 6/2014 | Everton | H03F 3/45089 330/254 |
| 2021/0250004 | A1 * | 8/2021 | Kennan | H03F 1/301 |

* cited by examiner

OPEN-COLLECTOR VARIABLE GAIN AMPLIFIER AND METHOD THEREFOR

FIELD OF THE INVENTION

The present invention relates in general to semiconductor devices and, more particularly, to a circuit and method of providing an open-collector variable gain amplifier.

BACKGROUND

Semiconductor devices are commonly found in modern electronic products. Semiconductor devices vary in the number and density of electrical components. Discrete semiconductor devices generally contain one type of electrical component, e.g., light-emitting diode (LED), small signal transistor, resistor, capacitor, inductor, and oxide semiconductor field-effect transistor (MOSFET). Integrated semiconductor devices typically contain hundreds to millions of electrical components. Examples of integrated semiconductor devices include microcontrollers, microprocessors, and various analog and digital circuits.

Semiconductor devices perform a wide range of functions, such as signal amplification, optical signal processing, high-speed calculations, transmitting and receiving electromagnetic signals, controlling electronic devices, and transforming sunlight into electricity. Semiconductor devices are found in the fields of communications, power conversion, networks, computers, audio/video, and consumer products. Semiconductor devices are also found in military applications, aerospace, aviation, automotive, industrial controllers, and office equipment.

One type of circuit found in certain semiconductor devices is a variable gain amplifier (VGA). The conventional VGA receives a differential input signal and provides a differential output signal. The VGA may be implemented with a differential cascode-arranged transistor pair with the gain controlled at the VGA stage. The output of the VGA is terminated with a resistive load, i.e., a load-terminated VGA. The resistive load sets the gain at low frequency operation. However, the resistive load also reduces gain at higher frequency and reduces output power of the amplifier, as some power is consumed by the resistive load.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1A:
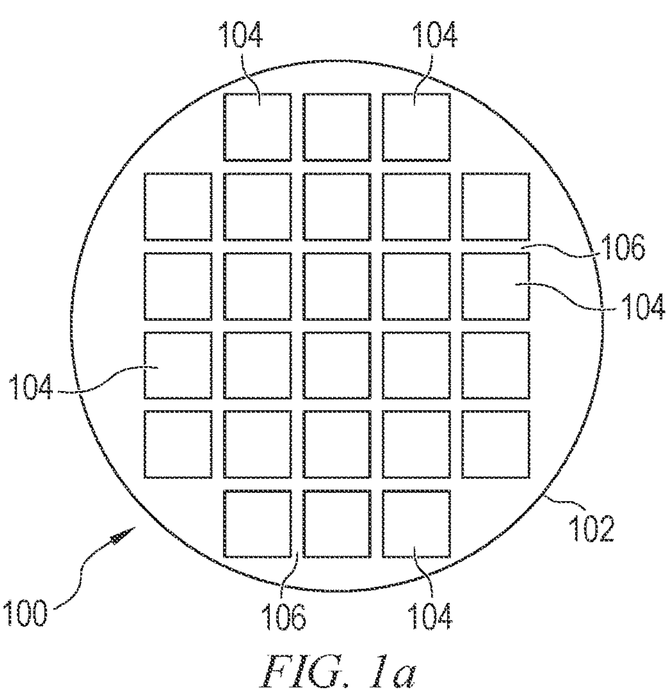
FIGS. 1*a*-1*c* illustrate a semiconductor wafer with a plurality of semiconductor die.

FIG. 1*a* shows semiconductor wafer or substrate 100 with a base substrate material 102, such as silicon (Si), silicon carbide (SiC), silicon germanium, aluminum phosphide, aluminum arsenide, gallium arsenide, gallium nitride, indium phosphide, and all families of III-V and II-VI semiconductor materials for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
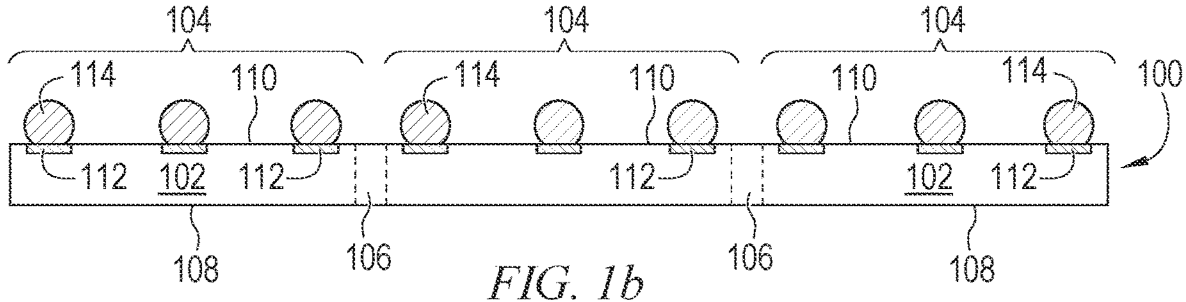

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more amplifiers, diodes, capacitors, and other circuit elements formed within active surface 110 to implement or be used with analog circuits or digital circuits. In the present embodiment, semiconductor die 104 contains a monolithic multi-stage variable gain amplifier.

An electrically conductive layer 112 is formed over active surface 110 using PVD, CVD, electrolytic plating, electroless plating process, evaporation, or other suitable metal deposition process. Conductive layer 112 can be one or more layers of aluminum (Al), copper (Cu), tin (Sn), nickel (Ni), titanium (Ti), Platinum (Pt), gold (Au), silver (Ag), or other suitable electrically conductive material. Conductive layer 112 operates as contact pads electrically connected to the circuits on active surface 110.

Figure 1C:
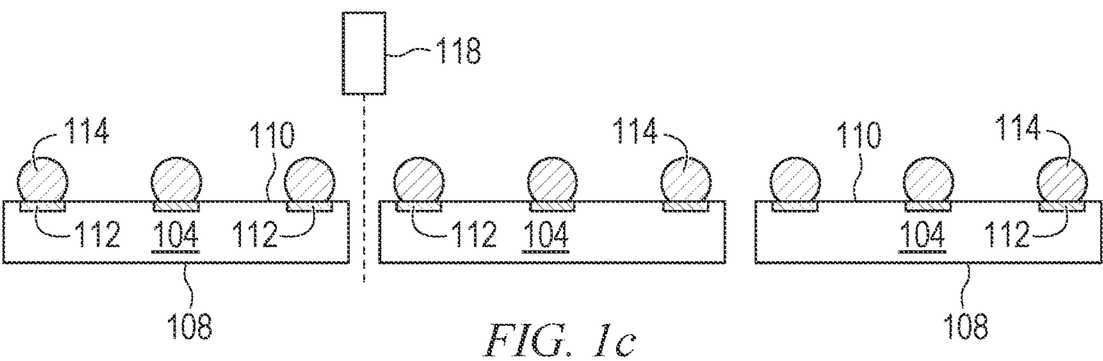

In FIG. 1*c*, semiconductor wafer 100 is singulated through saw street 106 using a scribe, saw blade, or laser cutting tool 118 into individual semiconductor die 104. The individual semiconductor die 104 can be inspected and electrically tested for identification of known good die or known good unit (KGD/KGU) post singulation.

Figure 2:
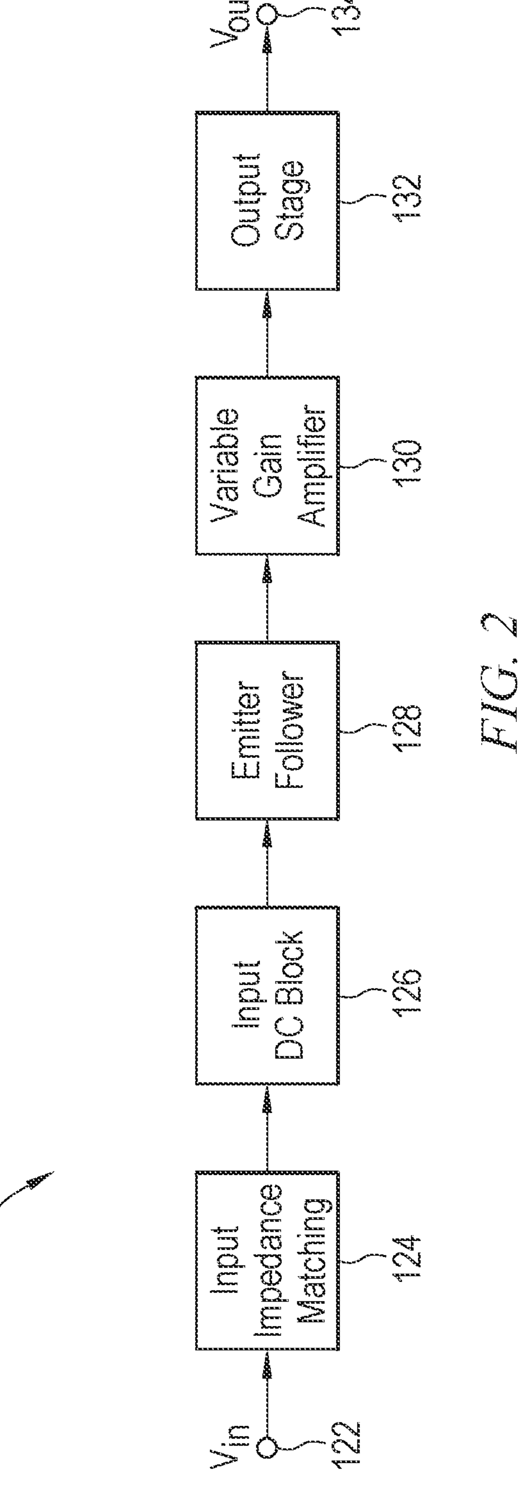
FIG. 2 illustrates a block diagram for a multi-stage VGA amplifier.

FIG. 2 illustrates multi-stage amplifier 120 with input terminal 122 and formed on a base substrate material 102. In one example, amplifier 120 can be used in an optical modulator driver for data transmission. Amplifier 120 includes multiple stages for signal conditioning and controlled amplification. Amplifier 120 can be differential or single-ended. Input impedance matching block 124 provides a matching impedance to the input impedance to minimize or eliminate reflections. Input direct current (DC) block 126 uses series capacitors to block or reduce DC components of the input signal $V_{IN}$. Emitter follower block 128 provides unity gain, high input impedance, and low output impedance to aid with impedance matching. Amplifier 120 includes voltage gain amplifier feature 130 and output stage or power amplifier 132 to provide output signal $V_{OUT}$ at terminal 134 as an amplified version of the input signal $V_{IN}$ having an amplitude controlled by control signals applied to or contained within VGA 130.

Figure 3:
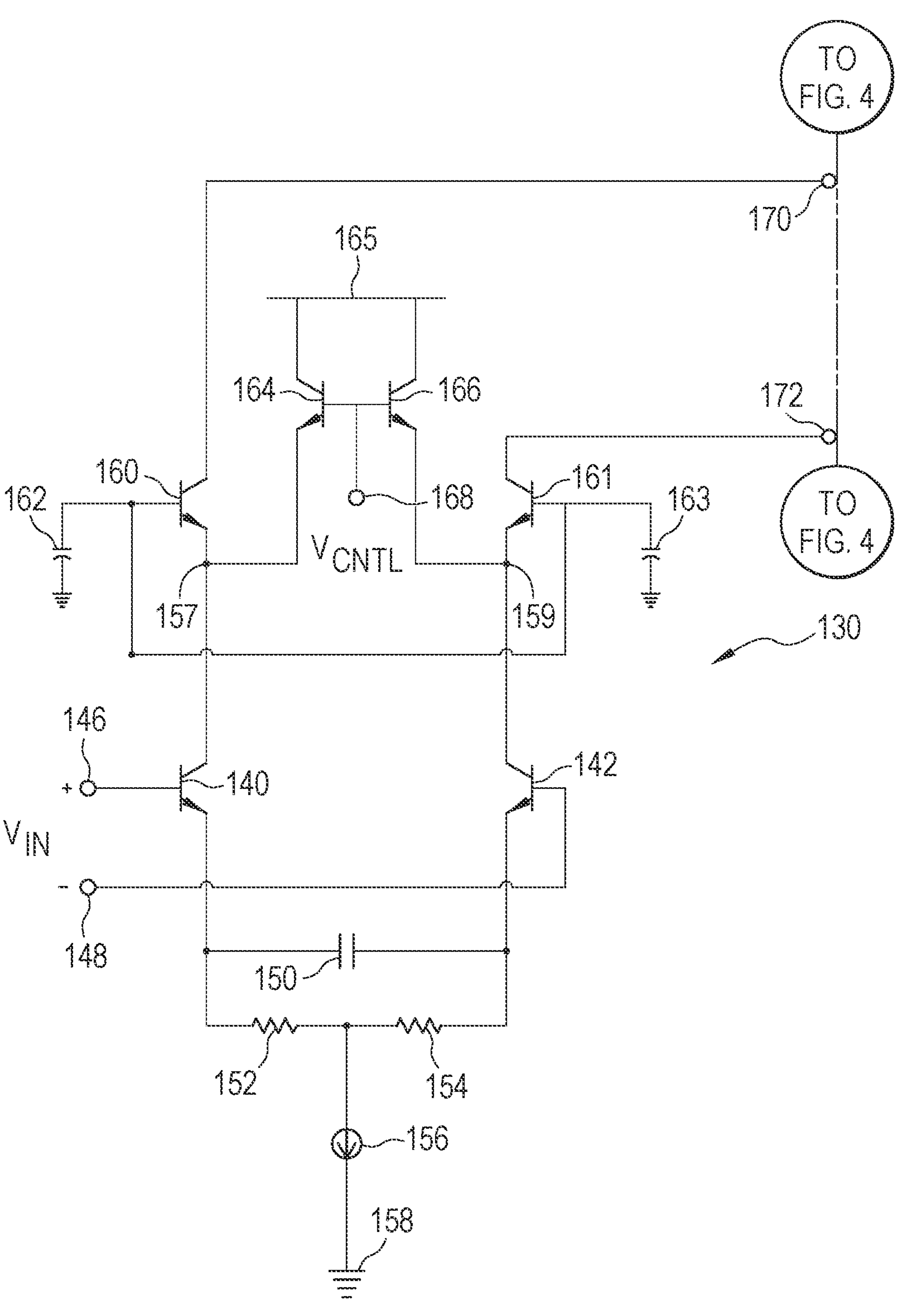
FIG. 3 illustrates further detail of the variable gain amplifier of FIG. 2.

FIG. 3 illustrates further detail of VGA 130. VGA 130 uses variable gain to pre-amplify the input signal $V_{IN}$, in a controllable or selectable manner, prior to output stage 132. In the present discussion, the input signal $V_{IN}$ is a differential input signal with a first + side and a second − side is applied to the base terminals of transistors 140 and 142 at terminals 146 and 148, respectively. Capacitor 150 is coupled between the emitter terminals of transistors 140 and 142. Resistors 152 and 154 are coupled between the emitter terminals of transistors 140 and 142 and current source 156 referenced to power supply terminal 158 operating at ground potential. The collector terminal of transistor 140 is coupled to the emitter terminal of transistor 160 at node 157. The collector terminal of transistor 142 is coupled to the emitter terminal of transistor 161 at node 159. Capacitor 162 is coupled between the base of transistor 160 and ground terminal 158. Capacitor 163 is coupled between the base of transistor 161 and ground terminal 158. Transistor 164 has a collector coupled to power supply conductor 165 operating at $V_{CC}$ and an emitter coupled to node 157. Transistor 166 has a collector coupled to power supply conductor 165 and an emitter coupled to node 159. The base terminals of transistors 164 and 166 receive control signal or reference signal $V_{CTRL}$ to set the gain of VGA 130. The control signal $V_{CTRL}$ can be fixed within VGA 130 during the manufacturing process or field calibration. For example, control signals $V_{CTRL}$ received a fixed reference voltage. Alternatively, control signal $V_{CTRL}$ is selectable during the operation of VGA 130 with a register and/or controllable voltage source. Transistors 140, 142, 160, and 161 operate as a differential cascode pair. The collector terminals of transistors 160 and 161 are, relative to VGA 130, open-collectors or open-conduction outputs 170 and 172.

Figure 4:
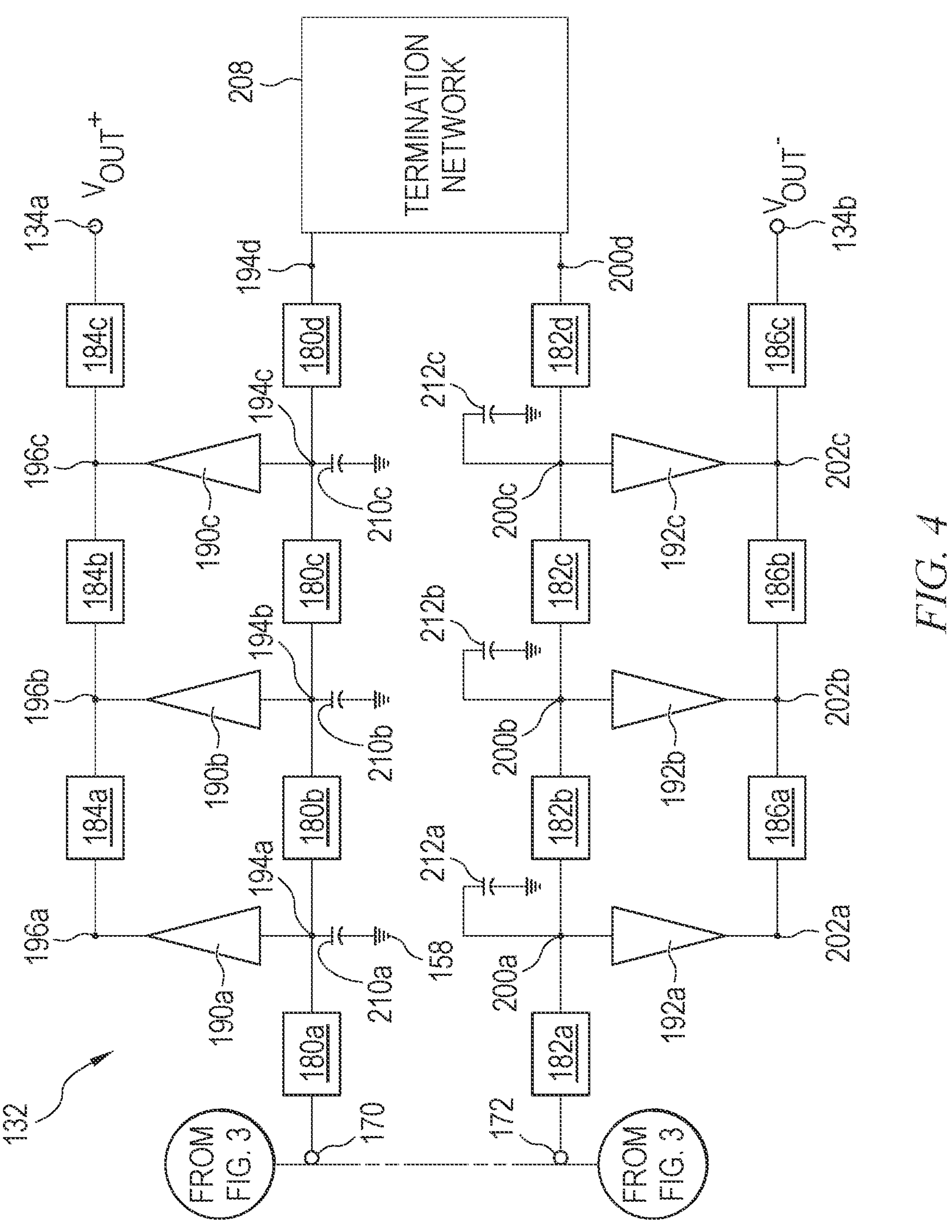
FIG. 4 illustrates further detail of the output stage of FIG. 2.
Figure 5:
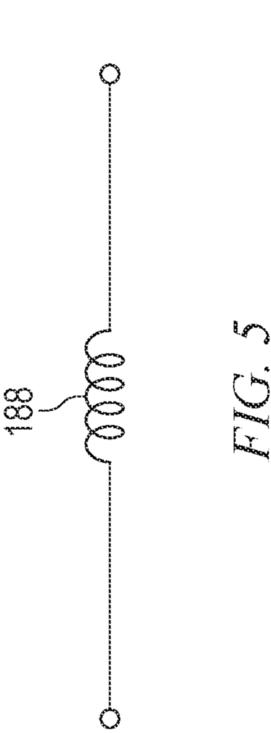
FIG. 5 illustrates a representation of the input transmission line and output transmission line.

FIG. 4 illustrates further detail of output stage 132 coupled to open-collectors 170 and 172 of VGA 130. Output stage 132 includes a plurality of input transmission lines 180*a*-180*d* and 182*a*-182*d* and a plurality of output transmission lines 184*a*-184*c* and 186*a*-186*c*. Input transmission lines 180*a*-180*d* and 182*a*-182*d* and output transmission lines 184*a*-184*c* and 186*a*-186*c* can be represented as inductor 188 with inductive properties, as shown in FIG. 5. In one embodiment, inductor 188 can have a range of values between 50-200 pico-Henries.

A plurality of gain cells 190 and 192 is distributed and coupled between input transmission lines 180*a*-180*d* and 182*a*-182*d* and output transmission lines 184*a*-184*c* and 186*a*-186*c*, hence output stage 132 is a distributed amplifier. In one embodiment, gain cell 190 can be implemented with an emitter follower configured transistor and differential pair of transistors, see FIG. 7 for further information. Gain cell 190*a* is coupled between input transmission lines 180*a*-180*b* at node 194*a* and output transmission line 184*a* at node 196*a*. Gain cell 190*b* is coupled between input transmission lines 180*b*-180*c* at node 194*b* and output transmission lines 184*a*-184*b* at node 196*b*. Gain cell 190*c* is coupled between input transmission lines 180*c*-180*d* at node 194*c* and output transmission lines 184*b*-184*c* at node 196*c*. Gain cell 192*a* is coupled between input transmission lines 182*a*-182*b* at node 200*a* and output transmission line 186*a* at node 202*a*. Gain cell 192*b* is coupled between input transmission lines 182*b*-182*c* at node 200*b* and output transmission lines 186*a*-186*b* at node 202*b*. Gain cell 192*c* is coupled between input transmission lines 182*c*-182*d* at node 200*c* and output transmission lines 186*b*-186*c* at node 202*c*.

Termination network 208 is coupled to the end of input transmission lines 180 and 182, i.e., node 194*d* and 200*d* at the output of input transmission lines 180*d* and 182*d*. Termination network 208 can be implemented as a first resistor from node 194*d* to ground and a second resistor from node 200*d* to ground. Capacitor 210*a* is coupled between node 194*a* and ground terminal 158, capacitor 210*b* is coupled between node 194*b* and ground terminal 158, and capacitor 210*c* is coupled between node 194*c* and ground terminal 158. Capacitor 212*a* is coupled between node 200*a* and ground terminal 158, capacitor 212*b* is coupled between node 200*b* and ground terminal 158, and capacitor 212*c* is coupled between node 200*c* and ground terminal 158. In one embodiment, capacitors 210-212 represent effective input capacitance of gain cells 190-192. Output terminals 134*a* and 134*b* provide the differential output signal $V_{OUT}$+ and $V_{OUT}$− of amplifier 120.

Figure 6:
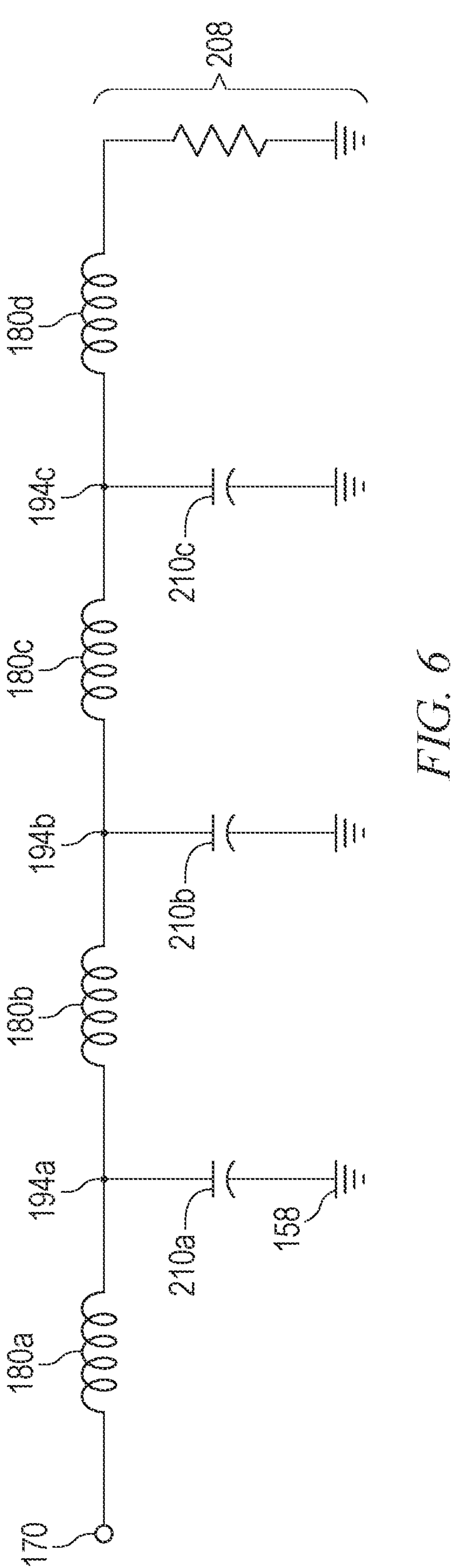
FIG. 6 illustrates one branch of the input transmission line.

FIG. 6 shows an example of one branch of open-collector 170, output lines 180*a*-180*d*, effective capacitors 210*a*-210*c*, and termination network 208. The impedance of termination network 208 is set to be equal to the impedance of input transmission lines 180*a*-180*d*.

Figure 7:
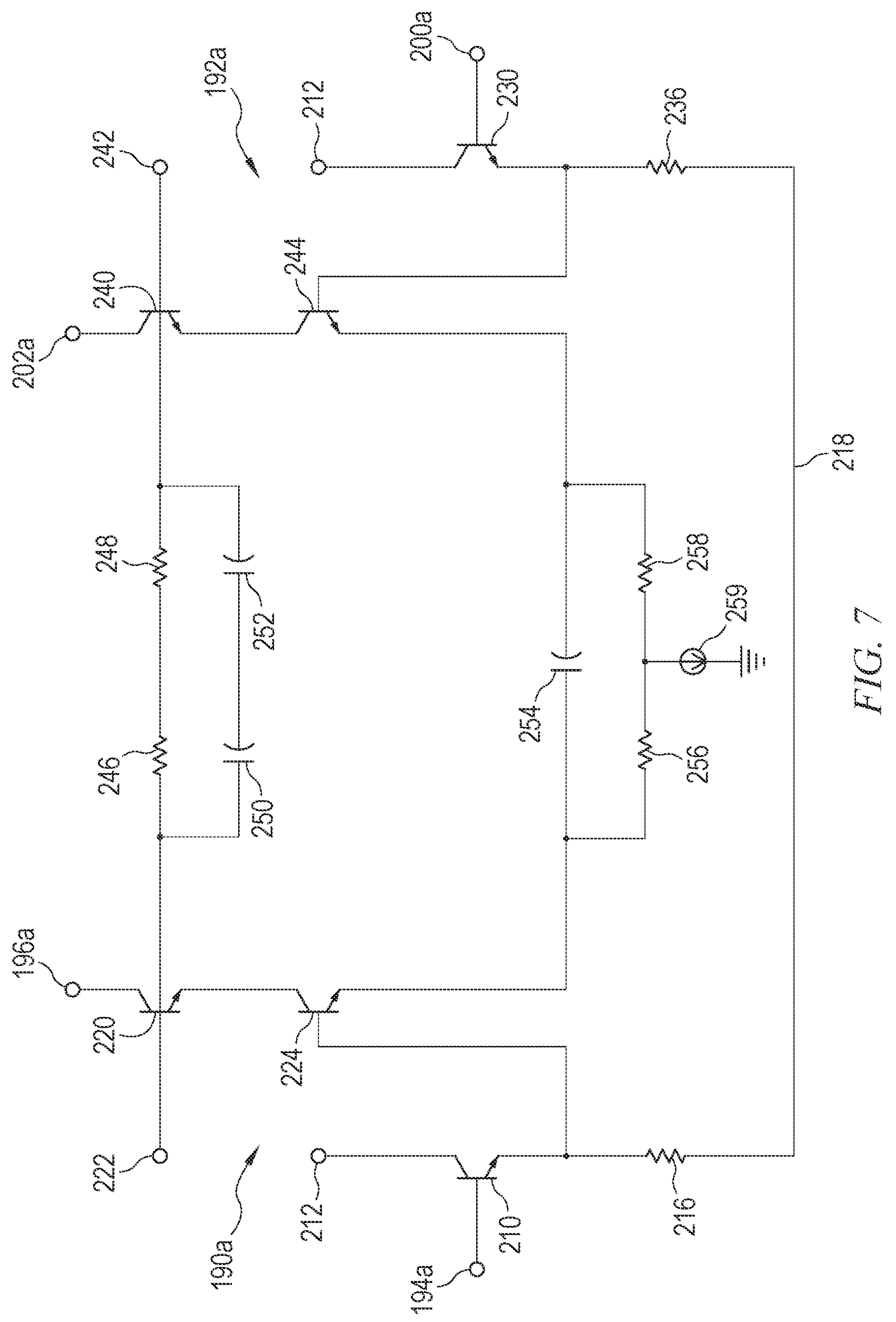
FIG. 7 illustrates further detail of a gain cell from FIG. 4.

FIG. 7 illustrates an implementation of gain cells 190*a* and 192*a*. Transistor 210 has a collector coupled to power supply conductor 212 operating at a positive power supply potential such as $V_{CC}$, base coupled to node 194*a*, and emitter coupled through resistor 216 to power supply conductor 218. Transistor 220 has a collector coupled to node 196*a* and base coupled to node 222 to receive a biasing signal. Transistor 224 has a collector coupled to the emitter of transistor 220 and base coupled to the emitter of transistor 210. Transistor 230 has a collector coupled to power supply conductor 212, base coupled to node 200*a*, and emitter coupled through resistor 236 to power supply conductor 218. Transistor 240 has a collector coupled to node 202*a* and base coupled to node 242 to receive a biasing signal. Transistor 244 has a collector coupled to the emitter of transistor 240 and base coupled to the emitter of transistor 230. Resistors 246 and 248 are coupled between nodes 222 and 242. Capacitors 250 and 252 are coupled between nodes 222 and 242. Capacitor 254 is coupled between the emitter of transistor 224 and the emitter of transistor 244. Resistors 256 and 258 are coupled between the emitter of transistor 224 and the emitter of transistor 244. Current source 259 is coupled between resistors 256 and 258 and ground terminal. The input signal $V_{IN}$ is amplified through gain cells 190*a* and 192*a* between nodes 194*a*, 200*a* and nodes 196*a*, 202*a*. Gain cells 190*b*, 192*b*, 190*c*, and 192*c* would follow a similar construction.

Figure 8:
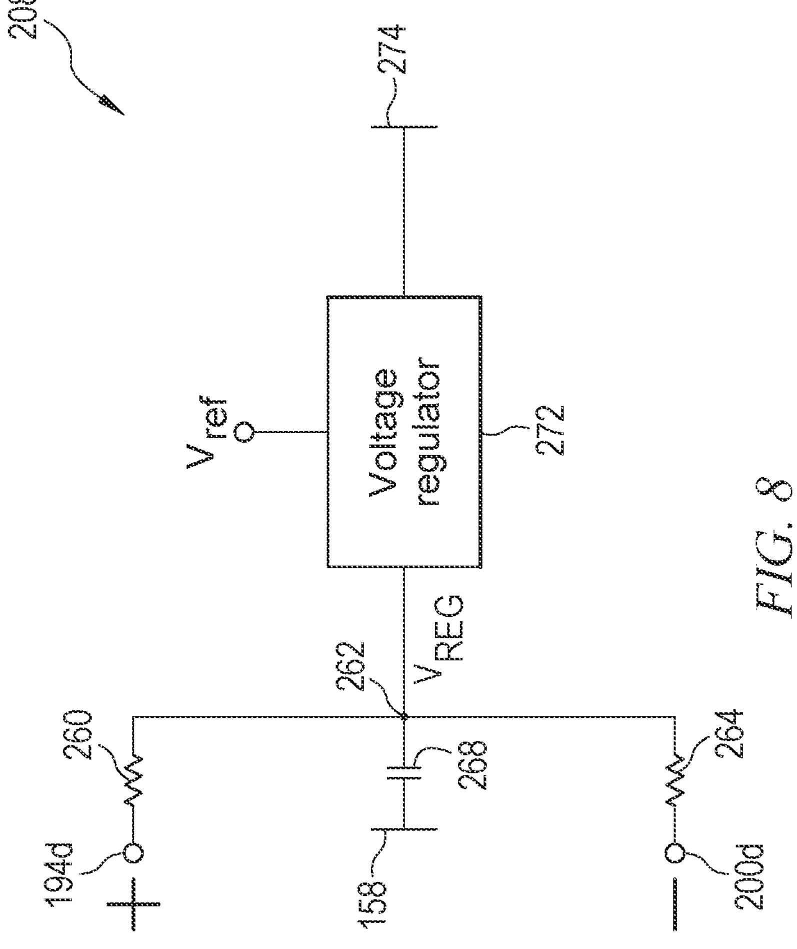
FIG. 8 illustrates further detail of the termination network from FIG. 4.

FIG. 8 illustrates an implementation of termination network 208. Resistor 260 is coupled between node 194*d* and node 262. Resistor 264 is coupled between node 200*d* and node 262. Capacitor 268 is coupled between node 262 and power supply terminal 158. Voltage regulator 272 provides a regulated voltage VREG source from reference voltage $V_{REF}$ and power supply conductor 274.

Figure 9:
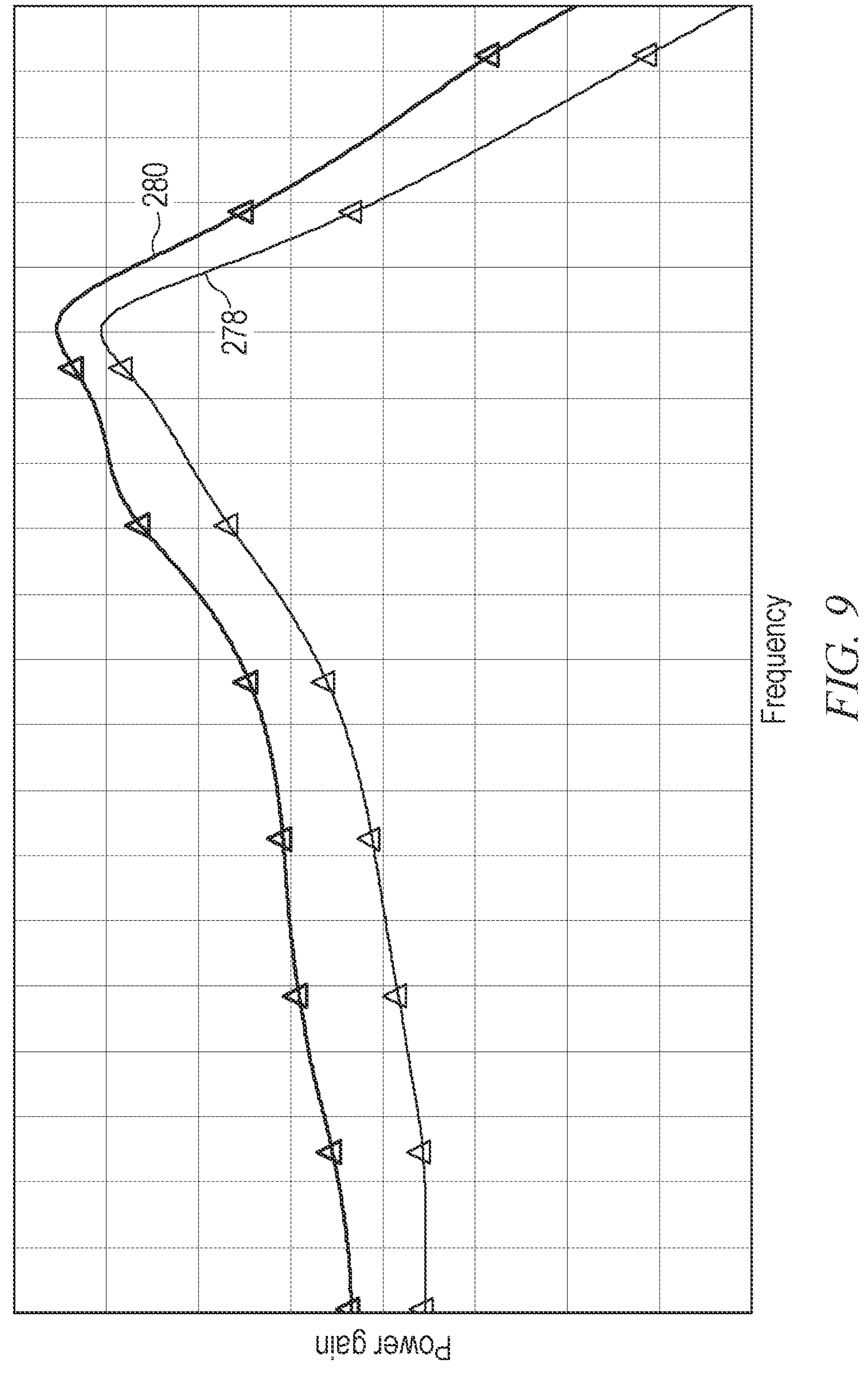
FIG. 9 illustrates a waveform plot of power gain versus frequency for a conventional VGA and the VGA of the present invention.

FIG. 9 is a waveform plot of power gain versus frequency for a conventional VGA 278, as described in the background, VGA 130 and output stage 132 from FIG. 2-4. VGA 130 has an open-collector output coupled to output stage 132. The open-collector feature of VGA 130 eliminates the load resistance commonly found in the conventional VGA. VGA 130 and output stage 132 reduce the DC component needed to sufficiently drive the output stage resulting in a lower power consumption within the VGA, greater power transfer to the output stage, and an increase in gain.

The transistor described herein can be implemented as bipolar devices or metal oxide semiconductor (MOS) devices. For the bipolar transistor, the control terminal is the base and the first and second conduction terminals are the collector and emitter. For the MOS transistor, the control terminal is the gate and the first and second conduction terminals are the drain and source.

While one or more embodiments of the present invention have been illustrated in detail, the skilled artisan will appreciate that modifications and adaptations to those embodiments may be made without departing from the scope of the present invention as set forth in the following claims.

What is claimed:

1. An amplifier circuit, comprising:

a variable gain amplifier including an input receiving an input signal and an open-conduction output having no connection within the variable gain amplifier to a first power supply terminal, wherein the variable gain amplifier includes, (a) a first transistor including a control terminal coupled for receiving a first component of the input signal, (b) a second transistor including a control terminal coupled for receiving a second component of the input signal, (c) a third transistor including a control terminal coupled for receiving a first component of a control signal and a first conduction terminal coupled to a first conduction terminal of the first transistor and a second conduction terminal being a first terminal of the open-conduction output of the variable gain amplifier having no connection within the variable gain amplifier to the first power supply terminal, and (d) a fourth transistor including a control terminal coupled for receiving a second component of the control signal and a first conduction terminal coupled to a first conduction terminal of the second transistor and a second conduction terminal being a second terminal of the open-conduction output of the variable gain amplifier having no connection within the variable gain amplifier to the first power supply terminal; and an output stage including an input coupled to the open-conduction output of the variable gain amplifier and an output providing an output signal of the amplifier circuit.

2. The amplifier circuit of claim 1, wherein the variable gain amplifier further includes:

a first resistor coupled between a second conduction terminal of the first transistor and a second power supply terminal;

a second resistor coupled between a second conduction terminal of the second transistor and the second power supply terminal; and a capacitor coupled between the second conduction terminal of the first transistor and the second conduction terminal of the second transistor.

3. The amplifier circuit of claim 1, wherein the output stage includes:

a first input transmission line including an input coupled to the first terminal of the open-conduction output of the variable gain amplifier;

a second input transmission line including an input coupled to an output of the first input transmission line at a first node;

a first gain cell including an input coupled to the first node; and a first output transmission line including an input coupled to an output of the first gain cell and an output providing a first component of the output signal of the amplifier circuit.

4. The amplifier circuit of claim 3, wherein the output stage further includes:

a third input transmission line including an input coupled to the second terminal of the open-conduction output of the variable gain amplifier;

a fourth input transmission line including an input coupled to an output of the third input transmission line at a second node;

a second gain cell including an input coupled to the second node;

a termination circuit coupled to an output of the second input transmission line and to an output of the fourth input transmission line; and a second output transmission line including an input coupled to an output of the second gain cell and an output providing a second component of the output signal of the amplifier circuit.

5. The amplifier circuit of claim 4, wherein the termination circuit includes:

a first resistor coupled between the output of the second input transmission line and a voltage source; and a second resistor coupled between the output of the fourth input transmission line and the voltage source.

6. A semiconductor device comprising an amplifier circuit, including:

a variable gain amplifier including an input receiving an input signal and an open-conduction output having no other connection within the variable gain amplifier, wherein the variable gain amplifier includes, (a) a first transistor including a control terminal coupled for receiving a first component of the input signal, (b) a second transistor including a control terminal coupled for receiving a second component of the input signal, (c) a third transistor including a control terminal coupled for receiving a first component of a control signal and a first conduction terminal coupled to a first conduction terminal of the first transistor and a second conduction terminal being a first terminal of the open-conduction output of the variable gain amplifier having no other connection within the variable gain amplifier, and (d) a fourth transistor including a control terminal coupled for receiving a second component of the control signal and a first conduction terminal coupled to a first conduction terminal of the second transistor and a second conduction terminal being a second terminal of the open-conduction output of the variable gain amplifier having no other connection within the variable gain amplifier; and an output stage including an input coupled to the open-conduction output of the variable gain amplifier and an output providing an output signal of the amplifier circuit.

7. The semiconductor device of claim 6, wherein the variable gain amplifier further includes:

a first resistor coupled between a second conduction terminal of the first transistor and a power supply terminal;

a second resistor coupled between a second conduction terminal of the second transistor and the power supply terminal; and a capacitor coupled between the second conduction terminal of the first transistor and the second conduction terminal of the second transistor.

8. The semiconductor device of claim 6, wherein the output stage includes:

a first input transmission line including an input coupled to the first terminal of the open-conduction output of the variable gain amplifier;

a second input transmission line including an input coupled to an output of the first input transmission line at a first node;

a first gain cell including an input coupled to the first node; and a first output transmission line including an input coupled to an output of the first gain cell and an output providing a first component of the output signal of the amplifier circuit.

9. The semiconductor device of claim 8, wherein the output stage further includes:

a third input transmission line including an input coupled to the second terminal of the open-conduction output of the variable gain amplifier;

a fourth input transmission line including an input coupled to an output of the third input transmission line at a second node;

a second gain cell including an input coupled to the second node;

a termination circuit coupled to an output of the second input transmission line and to an output of the fourth input transmission line; and a second output transmission line including an input coupled to an output of the second gain cell and an output providing a second component of the output signal of the amplifier circuit.

10. The semiconductor device of claim 9, wherein the termination circuit includes:

a first resistor coupled between the output of the second input transmission line and a voltage source; and a second resistor coupled between the output of the fourth input transmission line and the voltage source.

11. The semiconductor device of claim 8, wherein the first input transmission line includes inductive properties.

12. A method of making a semiconductor device comprising an amplifier circuit, including:

providing a substrate;

forming a variable gain amplifier including an input receiving an input signal and an open-conduction output over the substrate, wherein forming the variable gain amplifier includes, (a) providing a first transistor including a control terminal coupled for receiving a first component of the input signal, (b) providing a second transistor including a control terminal coupled for receiving a second component of the input signal, (c) providing a third transistor including a control terminal coupled for receiving a first component of a control signal and a first conduction terminal coupled to a first conduction terminal of the first transistor and a second conduction terminal being a first terminal of the open-conduction output of the variable gain amplifier having no other connection within the variable gain amplifier, and (d) providing a fourth transistor including a control terminal coupled for receiving a second component of the control signal and a first conduction terminal coupled to a first conduction terminal of the second transistor and a second conduction terminal being a second terminal of the open-conduction output of the variable gain amplifier having no other connection within the variable gain amplifier; and forming an output stage including an input coupled to the open-conduction output of the variable gain amplifier and an output providing an output signal of the amplifier circuit over the substrate.

13. The method of claim 12, wherein forming the variable gain amplifier further includes:

providing a first resistor coupled between a second conduction terminal of the first transistor and a power supply terminal;

providing a second resistor coupled between a second conduction terminal of the second transistor and the power supply terminal; and providing a capacitor coupled between the second conduction terminal of the first transistor and the second conduction terminal of the second transistor.

14. The method of claim 12, wherein forming the output stage includes:

providing a first input transmission line including an input coupled to the first terminal of the open-conduction output of the variable gain amplifier;

providing a second input transmission line including an input coupled to an output of the first input transmission line at a first node;

providing a first gain cell including an input coupled to the first node; and providing a first output transmission line including an input coupled to an output of the first gain cell and an output providing a first component of the output signal of the amplifier circuit.

15. The method of claim 12, wherein forming the output stage further includes:

providing a third input transmission line including an input coupled to the second terminal of the open-conduction output of the variable gain amplifier;

providing a fourth input transmission line including an input coupled to an output of the third input transmission line at a second node;

providing a second gain cell including an input coupled to the second node;

providing a termination circuit coupled to an output of the second input transmission line and to an output of the fourth input transmission line; and providing a second output transmission line including an input coupled to an output of the second gain cell and an output providing a second component of the output signal of the amplifier circuit.

16. The method of claim 12, wherein the termination circuit includes:

providing a first resistor coupled between the output of the second input transmission line and a voltage source; and providing a second resistor coupled between the output of the fourth input transmission line and the voltage source.

17. The method of claim 14, wherein the first input transmission line includes inductive properties.

* * * * *